(12) United States Patent
Stelmakh

(10) Patent No.: US 7,724,789 B2
(45) Date of Patent: May 25, 2010

(54) METHOD AND APPARATUS FOR OPTICAL MODE MULTIPLEXING OF MULTIMODE LASERS AND ARRAYS

(75) Inventor: Nikolai M. Stelmakh, Arlington, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 364 days.

(21) Appl. No.: 11/743,327

(22) Filed: May 2, 2007

(65) Prior Publication Data

US 2008/0273560 A1 Nov. 6, 2008

(51) Int. Cl.
*H01S 3/098* (2006.01)
(52) U.S. Cl. ................................. 372/26; 372/29.01
(58) Field of Classification Search .............. 372/29.02, 372/50.12, 22; 362/353; 385/4; 398/81
See application file for complete search history.

(56) References Cited

U.S. PATENT DOCUMENTS 4,757,268 A * 7/1988 Abrams et al. ............. 359/338
5,847,816 A 12/1998 Zediker et al.
6,490,064 B1 * 12/2002 Sakamoto et al. ............. 398/81
6,567,605 B1 * 5/2003 Rice et al. .................... 385/147
6,580,850 B1 * 6/2003 Kazarinov et al. ............ 385/28
7,212,738 B1 * 5/2007 Wang ............................ 398/2

* cited by examiner

*Primary Examiner*—Minsun Harvey
*Assistant Examiner*—Tuan N. Nguyen
(74) *Attorney, Agent, or Firm*—Chowdhury & Georgakis, P.C.

(57) ABSTRACT

According to methods and apparatus described herein, multimode laser source capable of emitting a diffraction-limited beam of various shapes (including single-lobe shape) can be realized. An optical apparatus for generating a such diffraction-limited beam comprises a spatial phase modulator for spatially modulating a spectrally dispersed optical signal emitted from a semiconductor laser into a combined-mode optical signal, wherein the lateral modes of the optical signal from the laser are combined into a diffraction-limited beam. Also, a coupling optical system is provided for wavelength-demultiplexing the multimode optical signal before the multimode optical signal is spatially modulated by the spatial phase modulator, and also for wavelength-multiplexing the combined-mode optical signal.

15 Claims, 12 Drawing Sheets

METHOD AND APPARATUS FOR OPTICAL MODE MULTIPLEXING OF MULTIMODE LASERS AND ARRAYS

TECHNICAL FIELD

This disclosure relates to systems and methods associated with optics for laser light, especially light emitted from semiconductor lasers.

BACKGROUND

There are several application areas that have a constant need for more efficient, more powerful, and better performing optical sources. Examples of such application areas include industrial processing, medical instrumentation, telecommunications, emerging high-definition compact disc recording devices, Light Detection and Ranging/Laser Detection and Ranging (LIDAR/LADAR) applications, and automotive applications. For several decades, research and development groups around the world have attempted to replace all types of lasers involved in these applications with more compact and efficient sources based on the direct use of semiconductor lasers.

An example of a laser is the laser diode. Laser diodes are ideal optical sources for many applications. They are efficient, compact, and readily available. Some applications for laser diodes have been extremely successful, such as in optical telecommunications and optical compact disc/digital versatile disc (cd/dvd) reader/writers. However, even though they are capable of high power output, their use as a direct light source have been primarily limited to applications that require only relatively low power. Their use as high-power direct light sources is limited by a complex mode structure of output emission at those power levels, preventing the simple and efficient coupling of the emission into a diffraction-limited beam.

To create high-power coherent beams, the light from the laser diodes is used as an energy pump for solid state lasers, such as the diode-laser-pumped solid-state lasers (DLPSS) and Raman/fiber lasers. This intermediate technical solution can be considered as an indirect (non-linear) mode reshaping. Such indirect techniques can produce significant power. However, they have significant fundamental conversion losses, and the total plug-in efficiency of such indirect sources is typically less than 30%. Furthermore, no direct-current modulation is possible with the laser-diode-pumped sources. These major drawbacks of indirect techniques have maintained the interest in direct semiconductor laser sources.

SUMMARY

Single-element semiconductor lasers, for example broad-area laser diodes, can be stimulated to produce multimode emission with tens of Watts of power. However, although it has been desirable to convert from a semiconductor laser into a single-lobe diffraction-limited beam, prior techniques for utilization of the high power output of semiconductor lasers have been cavity modification based (intrinsic cavity shape variations or adding of an external cavity) and focused on the selection and stabilization of the laser radiation into the single fundamental mode. These techniques in practical realizations suffer from low efficiency, instabilities, and low yield. The present disclosure describes a spectrally-resolved phase manipulation technique external to the laser cavity for reshaping the multimode emission of a conventional broad-area semiconductor laser into a diffraction-limited single-lobe spot. According to methods and apparatus described herein, an inexpensive, compact, efficient, high-power semiconductor laser source capable of emitting a single-lobe diffraction-limited beam can be realized. Also, methods and apparatus described herein can be extended to an array of lasers, especially broad-area laser diodes.

BRIEF DESCRIPTION OF THE DRAWINGS

Embodiments are illustrated by way of example in the accompanying figures, in which like reference numbers indicate similar parts, and in which.

DETAILED DESCRIPTION

Figure 1:
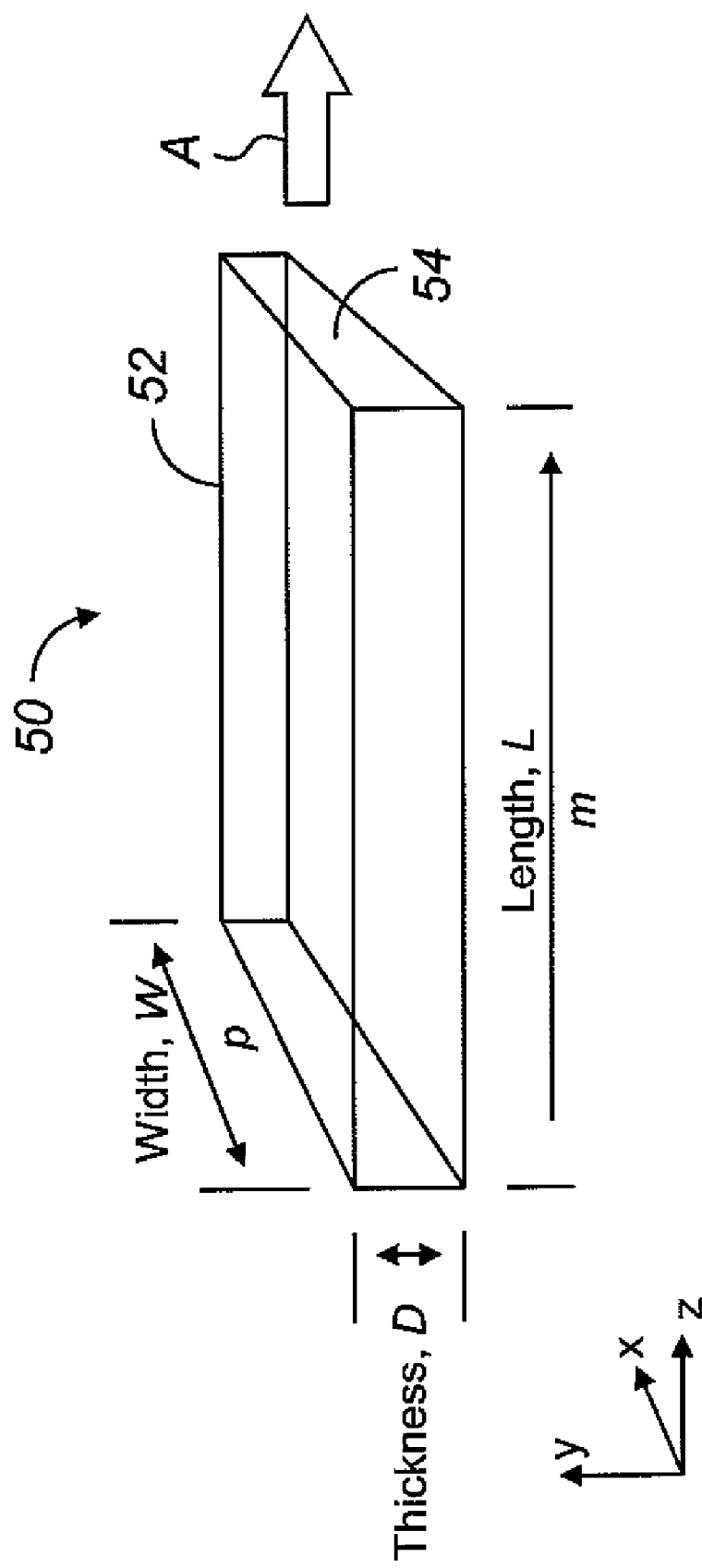
FIG. 1 shows a block diagram of an example of a broad-area semiconductor laser.

According to some aspects of the present disclosure, an optical apparatus comprises a semiconductor laser operable to emit a multimode optical signal having a plurality of lateral modes. A spatial phase modulator is provided for spatially modulating the multimode optical signal into a combined-mode optical signal, wherein the lateral modes are combined into a diffraction-limited beam. Also, a coupling optical system is provided for wavelength-demultiplexing the multimode optical signal before the multimode optical signal is spatially modulated by the spatial phase modulator, and also for wavelength-multiplexing the combined-mode optical signal.

The semiconductor laser can be, for example, an edge-emitting laser diode. According to some embodiments, the edge-emitting laser diode can be a broad-area laser diode.

The spatial phase modulator can include a binary one-layer phase mask. The binary phase mask can include a first region and a second region, wherein light passing through the first region experiences a 180 degree phase shift compared to light passing through the second region.

The coupling optical system can comprise a diffraction grating for both multiplexing and demultiplexing the optical signal. Alternatively, the coupling optical system can comprise a first diffraction grating for wavelength-demultiplexing the multimode optical signal before the multimode optical signal is spatially modulated by the spatial phase modulator, and a second diffraction grating for wavelength-multiplexing the combined-mode optical signal. In such embodiments, the first diffraction grating can be substantially the same as the second diffraction grating. Other types of wavelength dispersion elements in the coupling optical system can be used, for example Fabry-Perot dielectric cavities, Michelson ethalons, and mirror arrays.

According to other aspects of the present disclosure, a method is disclosed that includes providing a multimode optical signal emitted from a semiconductor laser, wherein the multimode optical signal comprises a plurality of lateral modes. The method then includes wavelength-demultiplexing the multimode optical signal to produce a spectrally-dispersed optical signal. Next, the method includes spatially modulating the spectrally-dispersed optical signal into a combined-mode optical signal wherein the lateral modes are combined into a diffraction-limited beam. The method further includes wavelength-multiplexing the combined-mode optical signal.

According to some embodiments, the semiconductor laser can be an edge-emitting laser diode. For example, the edge-emitting laser diode can be a broad-area laser diode.

The method can also include proving a binary phase mask for modulating the spectrally-dispersed optical signal. The binary phase mask can include a first region and a second region, wherein light passing through the first region experiences a 180 degree phase shift compared to light passing through the second region.

The method can further include providing a diffraction grating for both the wavelength-demultiplexing of the multimode optical signal and the wavelength-multiplexing of the combined-mode optical signal. Alternatively, the method can include providing a first diffraction grating for the wavelength-demultiplexing of the multimode optical signal and providing a second diffraction grating for the wavelength-multiplexing of the combined-mode optical signal. In such embodiments, the first diffraction grating can be substantially the same as the second diffraction grating.

Referring now to FIG. 1, which is a block diagram illustrating an example of a cavity of a broad-area semiconductor laser 50. Embodiments of the semiconductor laser 50 include laser diodes, for example broad-area laser diodes. In the illustrated embodiment, the semiconductor laser 50 has a cavity 52 in the shape of a rectangular parallelepiped of width W, length L, and thickness D. The optical mode structure of laser light emitted by the semiconductor laser 50 is determined, at least in part, by the dimensions of the cavity 52, the epitaxial material composition, and the thickness and boundary conditions. In the vertical (z) direction, the epitaxial structure is designed for fundamental (one-lobe) mode operation. The effective refractive index ($n_e$) is very close to the indicies of the epitaxial layers, for example having a value in the range of 3.2 to 3.4. In the longitudinal (propagation) direction (y), the cavity lengths can vary, for example from 500 µm to 3000 µm. As a result, the boundary condition on the longitudinal wave-vector $k_y$ can be expressed as:

$$k_y = \frac{\pi}{L} n_e m \tag{1}$$

In expression (1) above, m is a positive non-zero integer representing the longitudinal mode order, L is cavity length, and $n_e$ is refractive index. The result is numerous, for example approximately 40 to 100, longitudinal modes within the gain spectrum of the light emitted from the semiconductor laser 50. The width of the light emitted by the semiconductor laser 50 can be in the range of, for example, 50 µm to 200 µm, and the boundary condition on the lateral wave-vector $k_x$ can be expressed as:

$$k_x = \frac{\pi}{W} n_e p \tag{2}$$

In expression (2) above, p is a positive non-zero integer indicating the lateral mode order, L is cavity length, and $n_e$ is refractive index. The two conditions $k_x$ and $k_y$, along with the condition for the magnitude of the total wave-vector k ($k_x^2 + k_y^2 = k^2$), define the wavelength $\lambda_{m,p}$ of the cavity mode according to the following expression:

$$\lambda_{m,p} = 2n_e \bigg/ \sqrt{\frac{m^2}{L^2} + \frac{p^2}{W^2}} \tag{3}$$

The semiconductor laser 50 is operable to emit optical signals from output face 54 in the direction of the arrow A. The field profile on the laser output face 54 can be determined by the vertical and lateral boundary conditions. The vertical mode profile can be determined by the epitaxial structure and can be, for example, close to a Gaussian with a field size (1/e) of about 0.5 µm. In the lateral direction, the optical field can be determined by the anti-guiding lateral index profile. For the sake of simplicity, the near field at the laser facet can be represented with good precision according to expression (4) below for odd lateral modes and expression (5) below for even lateral modes.

$$E_p(x) = E_o \cos \frac{\pi p x}{W} \tag{4}$$

$$E_p(x) = E_o \sin \frac{\pi p x}{W} \tag{5}$$

In expressions (4) and (5), $E_o$ is the amplitude of the electrical field. Also, in expressions (4) and (5), $|x| \leq W/2$ and the field can be taken as zero for $|x| \geq W/2$. The corresponding far-field distributions can be calculated analytically from the Fourier transforms of the near field:

$$E_p(k_x) = E_o \frac{2W}{\pi p} \sin \frac{k_x W}{2} \bigg/ \left(1 - \frac{k_x^2 W^2}{\pi^2 p^2}\right) \text{ for odd } p \tag{6}$$

$$E_p(k_x) = iE_o \frac{2W}{\pi p} \sin \frac{k_x W}{2} \bigg/ \left(1 - \frac{k_x^2 W^2}{\pi^2 p^2}\right) \text{ for even } p \tag{7}$$

This simplified description provides a good estimation of experimental observations. The near-field profile maxima belonging to the same mode can interfere with each other, however the mode peaks with different indexes m and p are not coherent with each other.

The power can be considered to be approximately evenly distributed among all the lateral and the longitudinal modes. Modes with different indices p are approximately orthogonal, i.e., the overlap of the fundamental mode (p=1) with modes of lateral index of two and above is zero. Therefore, if the total number of lateral modes is P, focusing the laser output into a single-mode fiber with a lens system will at best capture one lateral mode, leading to a total power coupling efficiency of η=1/P. For example, for a laser diode with 1 W of output power with P~30 lateral modes, the power coupled into the fiber will be at most 30 mW.

However, each lateral mode can be reshaped into a distribution with a single peak by means of phase manipulation. A similar technique is used in Fresnel lens fabrication. (see Born, M., Wolf, E., *Principles of Optics* Chap. 8 (Cambridge Press, 2000)). After passing through a simple rectangular binary phase mask T(x) placed in the near-field plane of each mode, the far-field emission of each mode with lateral index p can be reshaped into one major lobe with small satellite lobes. The phase mask T(x) changes the phase by π at each zero value of the modal field. For the sake of simplicity, the analysis is separated for even and odd modes, so that $T^o$ is the phase mask for odd modes and $T^e$ is the phase mask for the even modes:

$$T_p^o(x) = \begin{cases} \pi, \text{ if } \cos\frac{\pi p x}{W} > 0 \\ 0, \text{ if } \cos\frac{\pi p x}{W} < 0 \end{cases}, p \in \{1, 3, 5 ...\} \quad (8)$$

$$T_p^e(x) = \begin{cases} \pi, \text{ if } \sin\frac{\pi p x}{W} > 0 \\ 0, \text{ if } \sin\frac{\pi p x}{W} < 0 \end{cases}, p \in \{2, 4, 6 ...\} \quad (9)$$

The far-field pattern, after passing through the binary mask, has the same form for both odd and even p and is given by:

$$E_p'(k_x) = E_0 \frac{2W}{\pi p} \cot\frac{k_x W}{2p} \sin\frac{k_x W}{2} \Big/ \left(1 - \frac{k_x^2 W^2}{\pi^2 p^2}\right) \quad (10)$$

According to the novel methods and apparatus disclosed herein, the lateral modes can be transformed to substantially the same profile as the fundamental mode of a laser emitted from a semiconductor laser, for example a broad-area laser diode, using an optical element to couple all of the lateral modes into a diffraction limited beam. The degree to which this can be achieved can be determined by calculating the overlap $\eta_p$ of the far-field profiles of the higher order modes with the fundamental mode, for example using the following expression:

$$\eta_p = \frac{\left|\int_{-\infty}^{\infty} E_p'(k_x) E_l^*(k_x) dk_x\right|^2}{\int_{-\infty}^{\infty} |E_p'(k_x)|^2 dk_x \int_{-\infty}^{\infty} |E_l(k_x)|^2 dk_x} \quad (11)$$

The power overlap value of any high-order mode $\eta_p$ with a fundamental mode is approximately 67%. For 10 lateral modes, the total coupling efficiency η=(1+9×0.67)/10≈70%. Hence, when the near-field profiles of different lateral modes are spectrally separated by a spatially-resolving monochromator and modulated with the phase mask disclosed herein, the outputs of all the modes from a semiconductor laser can be combined into a single-lobe diffraction-limited spot with, for example, approximately 70% efficiency.

Figure 2:
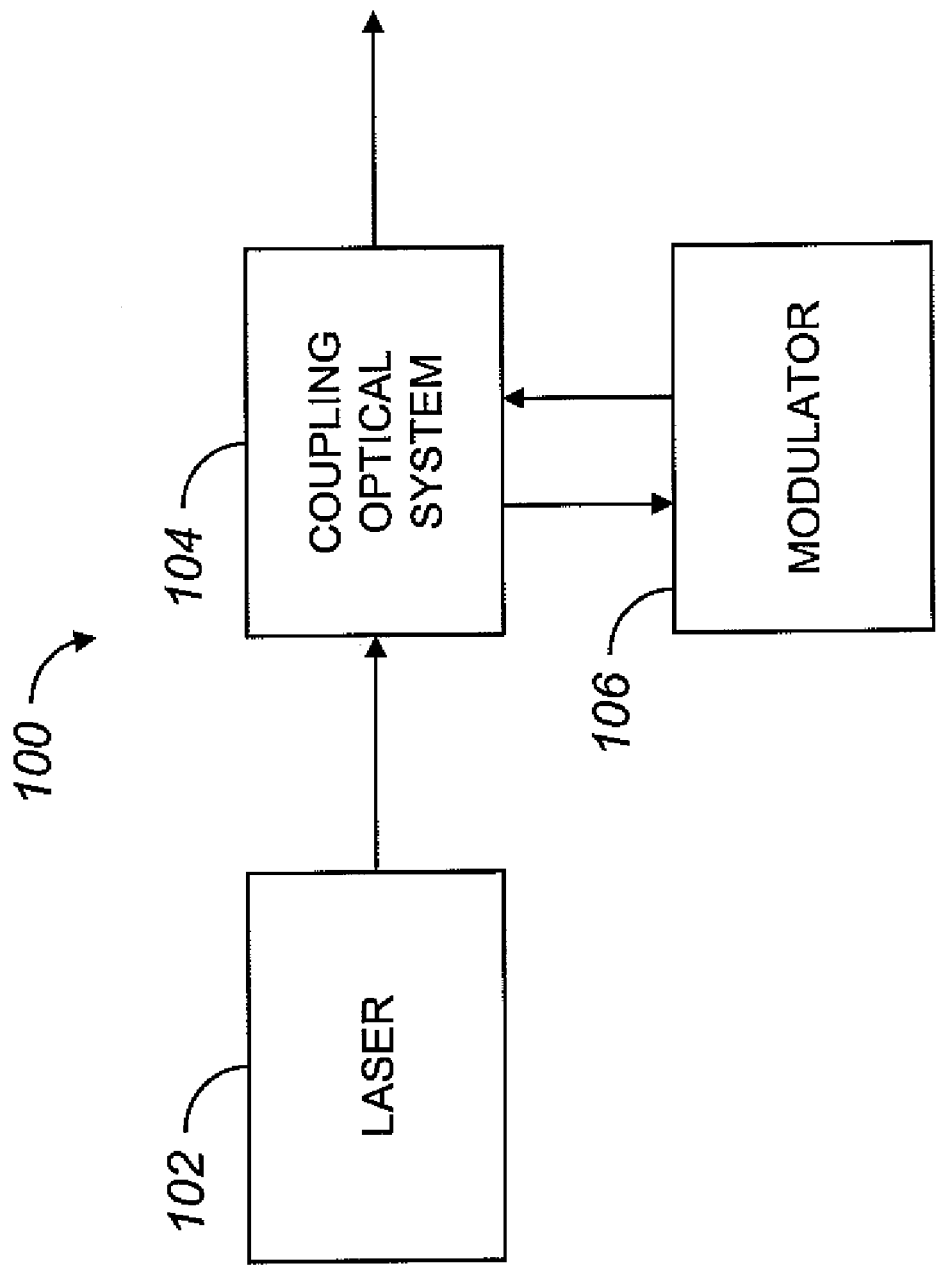
FIG. 2 shows a block diagram of an mode-coupling optical system.

FIG. 2 shows a block diagram of an optical system 100, which is an example of one embodiment of an optical system capable of combining the outputs of all the modes from a semiconductor laser 102 into a single-lobe diffraction-limited spot. The semiconductor laser 102 can be a single laser or an array of lasers. The optical system 100 includes a coupling optical system 104 and a modulator 106. The semiconductor laser 102 is operable to emit a multimode optical signal in the form of laser light. The semiconductor laser 102 is, in this example, a broad-area laser diode (or an array of broad-area laser diodes). The lateral modes of the laser light emitted from the semiconductor laser 102 are transformed by the modulator 106 to a profile substantially similar to that of the fundamental mode of the laser light. The modulator 106 comprises an optical element for coupling lateral modes of the laser light into a diffraction limited beam.

The optical signal is received by the coupling optical system 104, which provides spectral separation prior to modulation, and then spectrally combines the modulated optical signal. The coupling optical system 104 frequency-demultiplexes the optical signal and provides the demultiplexed optical signal to the modulator 106. Embodiments of the coupling optical system 104 can include one or more spectrometers, such as grating spectrometers. For example, the coupling optical system 104 can include one or more diffraction gratings, which can include one or more transmission and/or reflection types of diffraction gratings, regular and dielectric Fabry-Perot cavities, Michelson ethalons, and/or mirror arrays. In the examples given herein, the semiconductor laser 102 is comprised of a broad-area laser diode, and the spectral resolution (Δf) of the multiplexer/demultiplexer preferably meets the following condition:

$$\Delta f \leq \frac{3c\lambda}{8n^2 W^2} \quad (12)$$

In equation (12) above obtained from formula (3) by calculation the frequency difference between modes of indexes p=1 and p=2, c is the speed of light, k is wavelength, n is the refraction index of the laser diode active medium, and W is the width of the laser stripe. For example, for a typical 100 μm wide and 1 mm long broad-area laser diode, the resolution should preferably be better than 1 GHz.

The modulator 106 comprises at least one optical element suitable for coupling several or all of the lateral modes into a diffraction-limited beam. The modulator 106 preferably comprises, as an optical element, a phase mask. In a preferred embodiment, the phase mask performs wavelength-dependent spatial phase modulation on the received spectrally-demultiplexed optical signal so as to combine some or all of the modes of a multi-mode optical signal emitted from the semiconductor laser 102 into a single-lobe diffraction-limited beam. The result is an optical signal having longitudinal and lateral modes that are mutually phase-independent.

Figure 3:
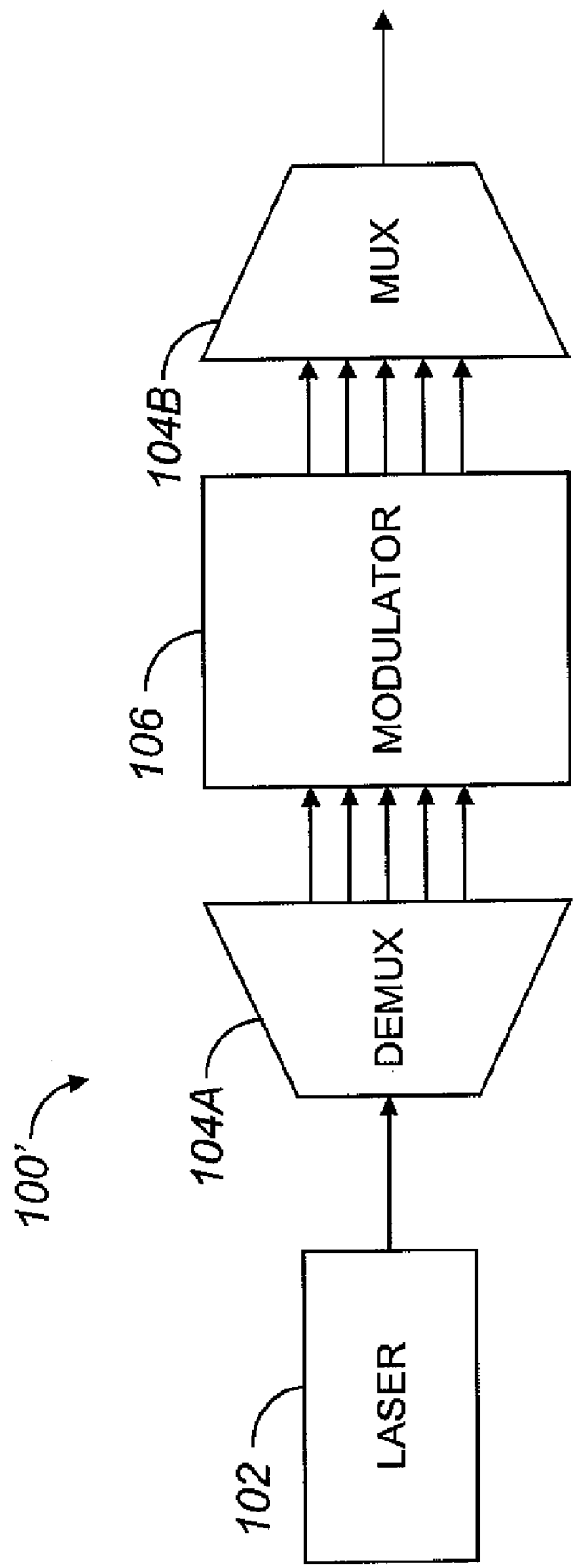
FIG. 3 shows a block diagram of a first example of the optical system shown in FIG. 2.
Figure 5:
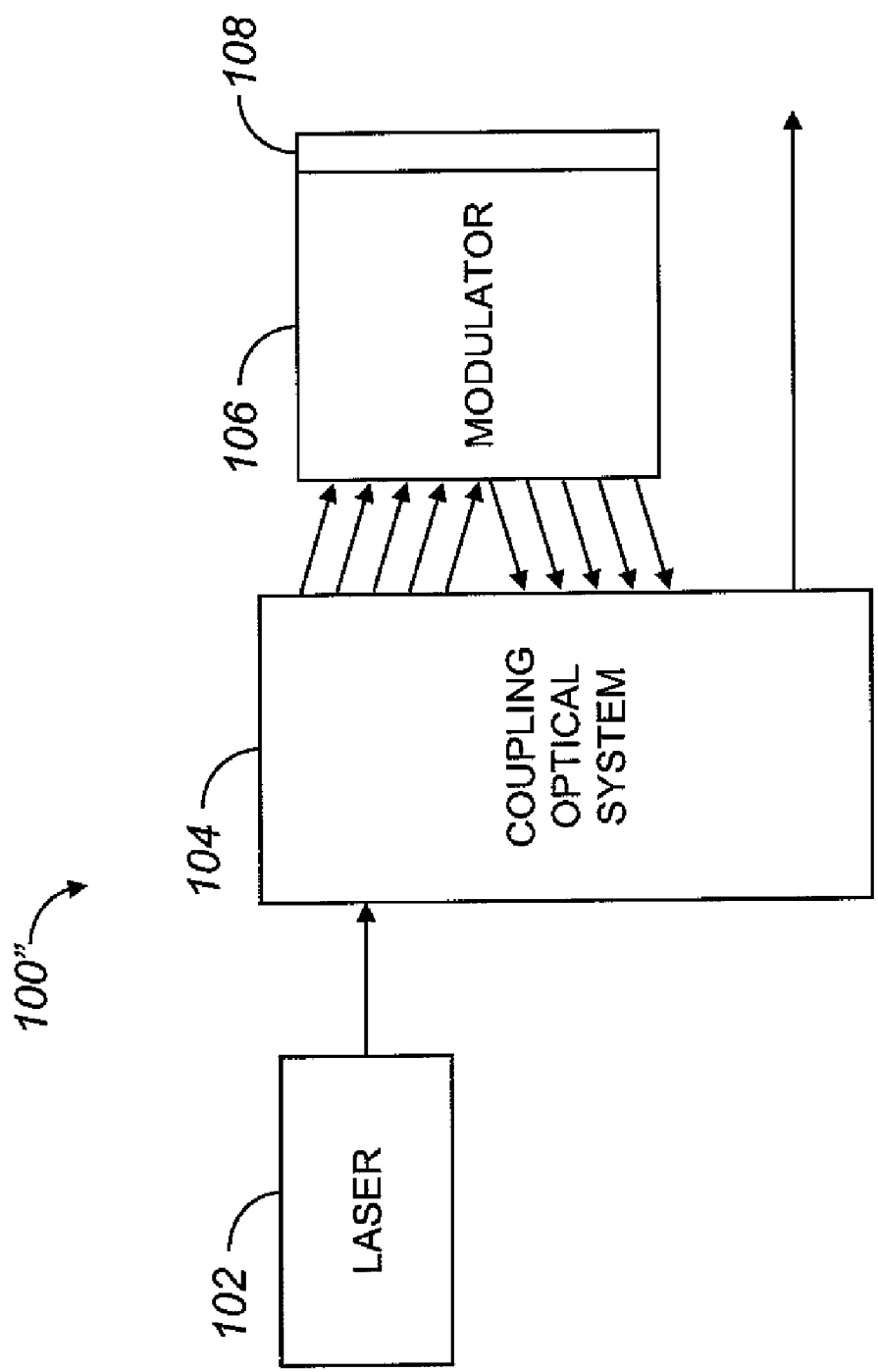
FIG. 5 shows a block diagram of a second example of the optical system shown in FIG. 2.

The coupling optical system 104 can include only a single optical element or can include multiple optical elements. FIGS. 3 and 5 show respective examples 100' and 100" of how the coupling optical system 104 can be configured or arranged. Substantially similar functions can be performed with other arrangements and configurations.

FIG. 3 shows a block diagram of the first example 100' of the optical system 100. In this first example 100', the coupling optical system 104 comprises a demultiplexer 104A and a multiplexer 104B. In some embodiments, the demultiplexer 104A can be a first spectral-separating optical element, for example a first diffraction grating, and the multiplexer 104B can be a second spectral-separating optical element, for example a second diffraction grating. The optical signal from the laser 102 is wavelength demultiplexed by the demultiplexer 104A before it arrives at the modulator 106. Note that the laser 102 can be a single-element multi-mode laser or an array of multi-mode lasers. The output from the modulator 106 is then provided to the multiplexer 104B, which outputs a wavelength-multiplexed optical signal.

Figure 4:
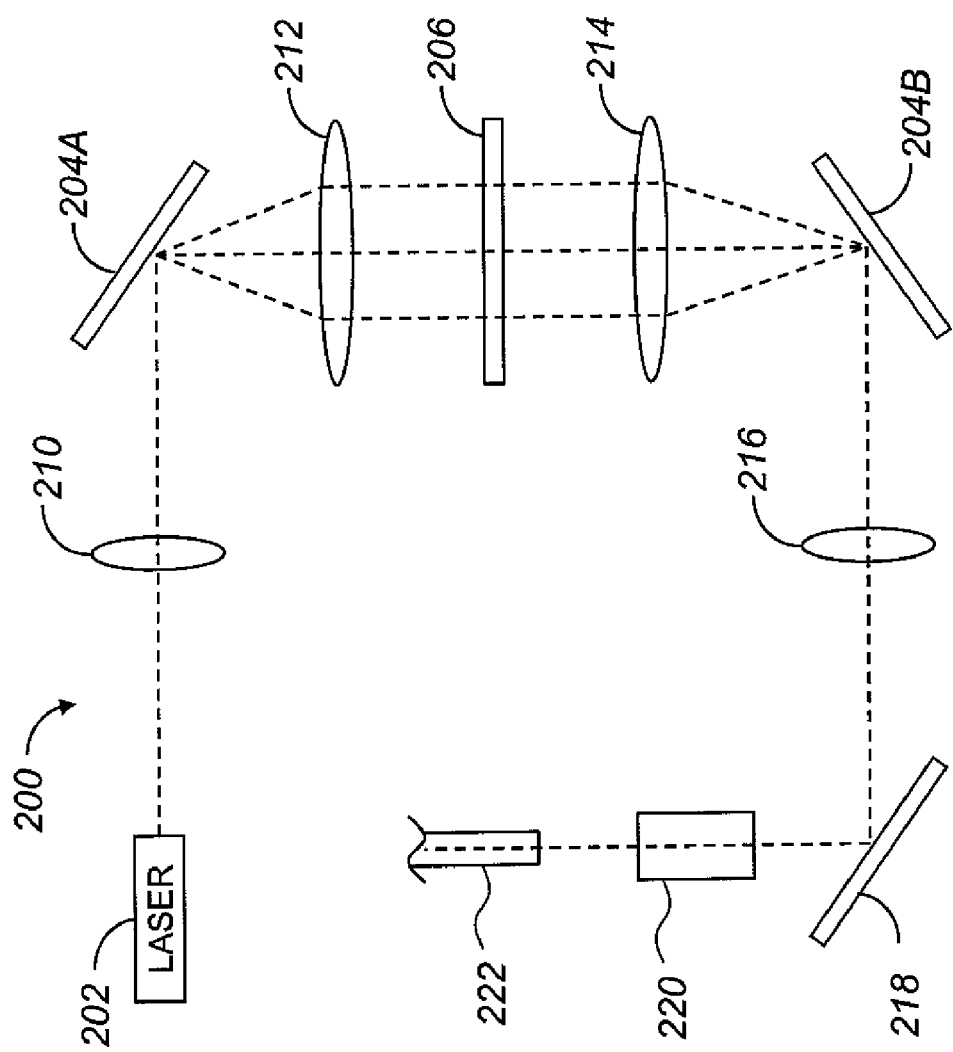
FIG. 4 shows a block diagram of more detailed first example of the optical system shown in FIG. 2.

FIG. 4 illustrates a block diagram of an optical system 200, which is a more detailed example of an optical system arranged according to the first example 100'. The semiconductor laser 202 is operable to emit a multimode optical signal. In some embodiments, the semiconductor laser 202 can be an edge-emitting laser diode, for example a broad-area laser diode. An array of multi-mode lasers can also be used as the semiconductor laser 202. The light from the semiconductor laser 202 is collimated by a collimating optical element 210. The optical element 210 can be, for example, a high numerical aperture lens. Next, the light is dispersed in wavelength by demultiplexer element 204A. In some embodiments, the demultiplexer element 204A can be, for example, a reflection-type diffraction grating. A first focusing optical element 212 is part of the demultiplexer (104A) for focusing the light onto a spectral plane where modulator 206 is placed.

The modulator 206 comprises an optical element suitable for coupling several or all of the lateral modes into a diffraction-limited beam. The modulator 206 preferably comprises, as the optical element, a phase mask as disclosed herein and described below in greater detail. The phase mask performs wavelength-dependent spatial modulation on the received demultiplexed optical signal so as to combine some or all of the modes of a multi-mode optical signal emitted from the semiconductor laser 202 into a single-lobe diffraction-limited beam. The result is an optical signal having longitudinal and lateral modes that are mutually phase-independent.

After the light is transmitted through the modulator 206, the light is wavelength multiplexed by a multiplexer 204B into an elliptical diffraction-limited optical signal. Note that the demultiplexer 204A and multiplexer 204B together constitute an example of the coupling optical system 104. In some embodiments, the multiplexer 204B can be, for example, a diffraction grating. In some embodiments, the demulitiplexer 204A and multiplexer 204B can be identical, or substantially identical, diffraction gratings.

Finally, an optical element 216, for example a focusing lens, and a plane mirror 218 are provided for focusing the light into an optical fiber 222. Astigmatism and ellipticity correction are provided by a correction optical system 220. For example, the correction optical system 220 reshapes the light to be circular, or substantially circular. In some embodiments, the correction optical system 220 can include an astigmatism-correction cylindrical lens whose focal length is appropriate for the specific characteristics of the laser light.

FIG. 5 shows a block diagram of a second example 100" of the optical system 100. In this second example, the coupling system 104 receives and wavelength-demultiplexes the optical signal from the laser 102. The modulator 106 is provided with a reflector 108, which can be, for example, a mirror or a reflective coating. The optical signal is directed back to the coupling optical system 104, which multiplexes and outputs the optical signal.

Figure 6:
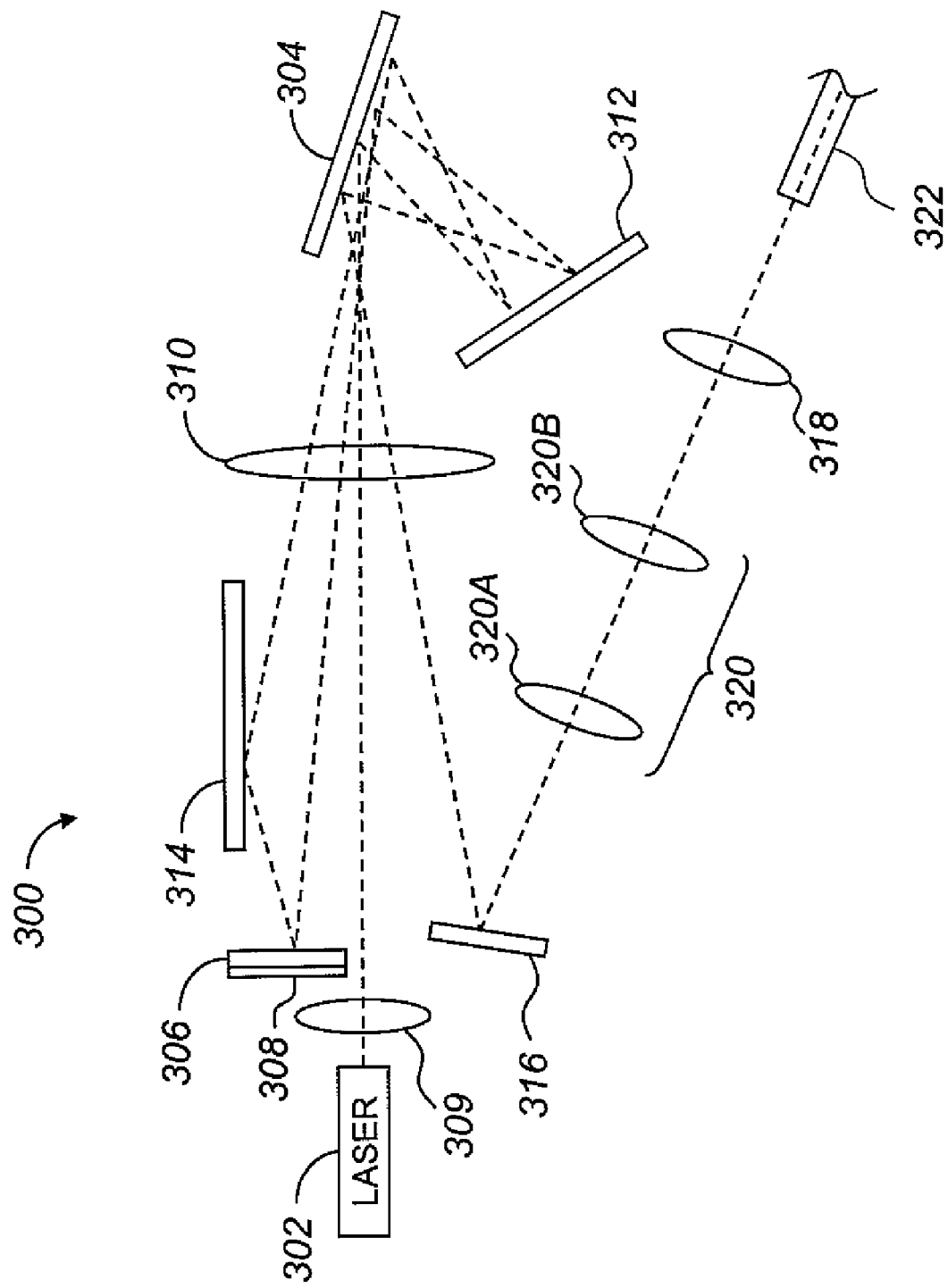
FIG. 6 shows a block diagram of more detailed second example of the optical system shown in FIG. 2.

FIG. 6 shows a block diagram of an optical system 300, which is a more detailed example of an optical system arranged according to the second example 100". The semiconductor laser 302 is operable to emit a multimode optical signal in the form of laser light. In some embodiments, the semiconductor laser 302 can be an edge-emitting laser diode, for example a broad-area laser diode. An array of multi-mode lasers can also be used as the semiconductor laser 302. The light from the semiconductor laser 302 is focused by optical elements 309 and 310 onto a wavelength dispersive element 304. The optical element 310 can be, for example, a high numerical aperture lens. Next, the light is dispersed in wavelength two times by the combination of the wavelength-dispersive element 304 and the mirror 312, which serve as an embodiment of the coupling optical system 104. In some embodiments, the wavelength-dispersive element 304 can be, for example, a reflection-type diffraction grating. By using the mirror 312 in combination with the wavelength dispersive element 304, the resolution of the wavelength-dispersive element 304 can be doubled. Thus, for example, an optical frequency resolution of 1 GHz can be reached with a relatively inexpensive 50 mm-long grating.

The optical element 310 then focuses the light onto a modulator 306. The modulator 306 comprises an optical element suitable for transforming several or all of the lateral modes into a single-lobe diffraction-limited beam. The modulator 306 preferably comprises, as the optical element, a phase mask as disclosed herein and described below in greater detail. The phase mask performs wavelength-dependent spatial modulation on the received demultiplexed optical signal so as to combine some or all of the modes of a multi-mode optical signal emitted from the semiconductor laser 302 into a single-lobe diffraction-limited beam. The result is an optical signal having longitudinal and lateral modes that are at least substantially mutually phase-independent. The modulator 306 is provided with a reflective coating or mirror 308, which allows the light to be relayed from the modulator 306 back to the coupling element 304 via a mirror 314 and the optical element 310. The light is then wavelength multiplexed by the combination of the coupling element 304 and the mirror 312 into an elliptical diffraction-limited optical signal.

Next, the light is relayed, via a mirror 316, to a correction optical system 320, which provides astigmatism and ellipticity correction. For example, the correction optical system 320 can be configured to reshape the light to be circular or substantially circular. In the illustrated embodiment, the correction optical system 320 includes optical elements 320A and 320B. The optical elements 320A and 320B can be, for example, astigmatism-correction cylindrical lenses. The positions of the optical elements 320A and 320B are preferably selected to provide circular output for near and far fields. Finally, an optical element 318, for example a focusing lens, is provided for focusing the light into an optical fiber 322. The position of the optical element 318 is selected to match the aperture of the optical fiber 322.

Figure 7:
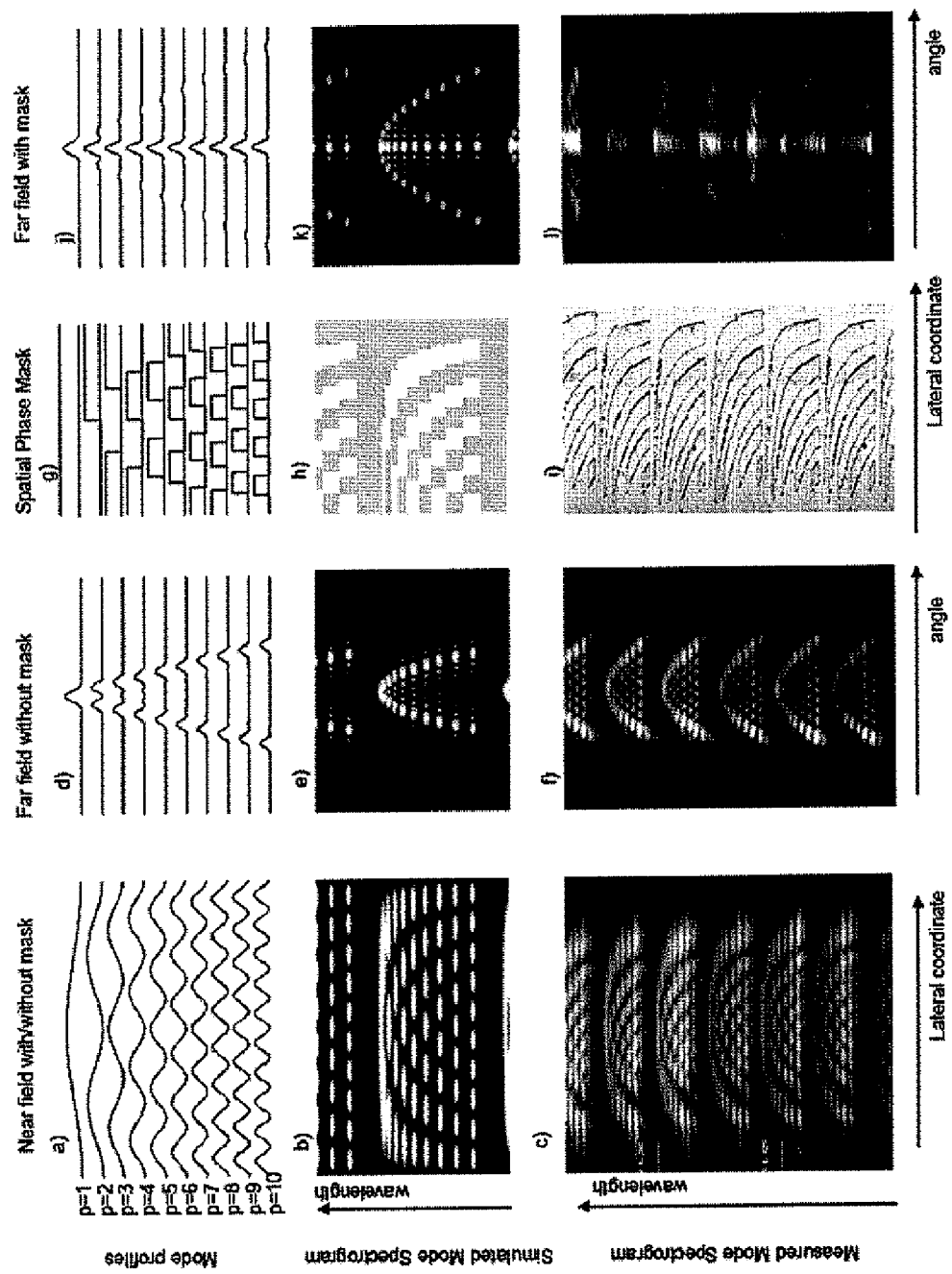
FIGS. 7a-7l show charts for summarizing and demonstrating the concept of reshaping the modes of a broad-area semiconductor laser.

FIGS. 7*a*-7*l* summarize and demonstrate the concept of reshaping the modes of a broad-area semiconductor laser Both theoretical and measured optical emission characteristics (near-field and far-field intensity patterns) of broad-area laser diodes are shown in FIGS. 7*a*-7*f*. FIGS. 7*g*-7*i* show the idealized properties and the practical realization of a spatial phase modulator that implements the binary function T(x) discussed above. FIGS. 7*j*-7*l* show the far-field intensity patterns after passing through the phase mask.

Figure 8:
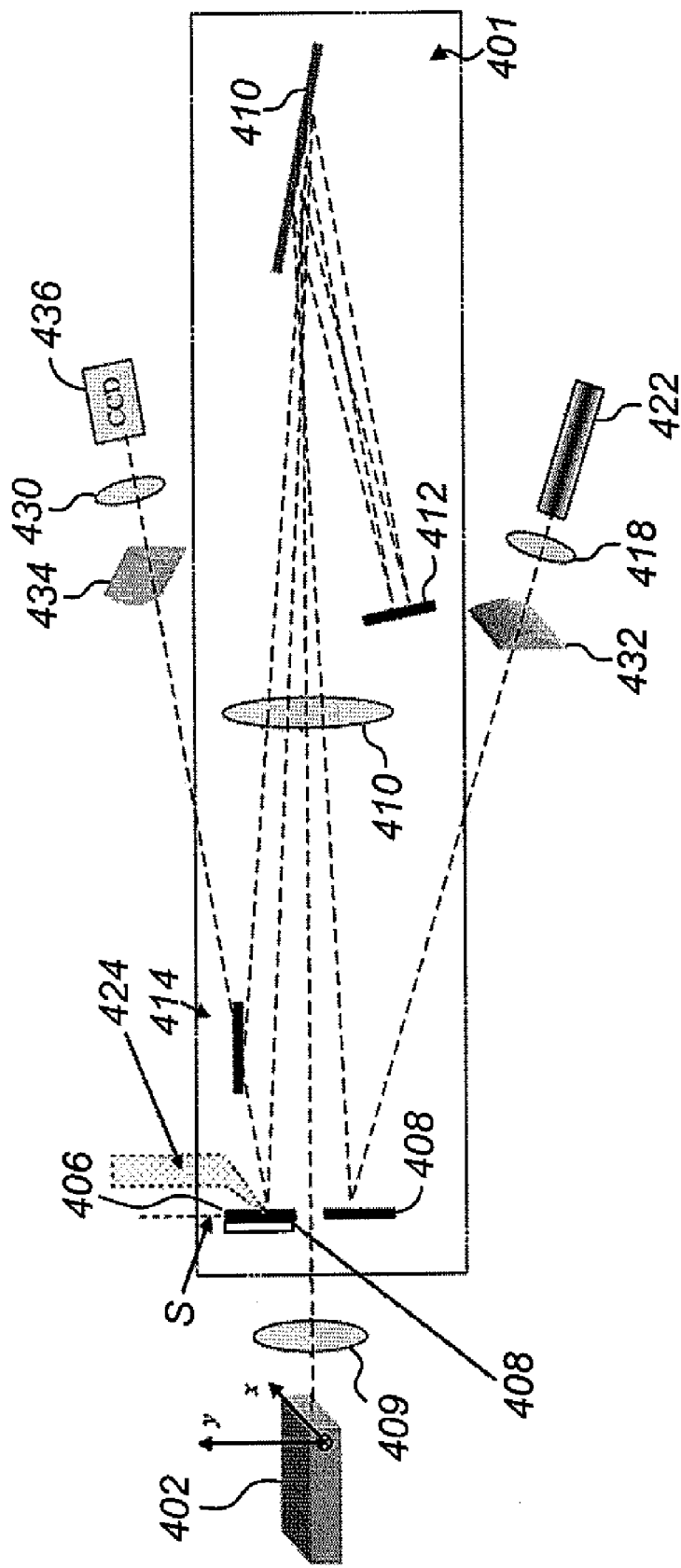
FIG. 8 shows a block diagram of a demonstration test apparatus.

To practically evaluate the potential of the apparatus and methods described herein, testing was conducted using the apparatus shown in FIG. 8. The laser 402 comprises a commercially available 980 nm broad-area laser diode having length L=1 mm and width W=100 μm. The apparatus includes a phase mask as the spatial phase modulator 406, a holographic grating 404, high-reflectivity mirrors 408, 412, 414, 416, lenses 409, 410, 418, 430, and cylindrical lenses 432, 434. The mirror 414 is a flipping mirror, which flips between a first position where the mirror 414 redirects light from the modulator 406 to the grating 404, and a second position that allows light to travel from the modulator 406 to a charge-coupled device (CCD) 436.

The modulator 406 is positioned in the spectral plane S of a high-resolution double-pass grating monochromator 401. The optical element 409 comprises an aspherical lens for imaging the facet of the laser diode 402 onto the input slit of the monochromator 401. The optical element 410 comprises an antireflection (AR) coated lens with a 1-meter focal length. The coupling element 404 comprises a holographic grating (1800 grooves/mm), and the mirror 412 comprises a double-pass mirror.

The lens 410, grating 404, and mirror 412 disperse the beam in the spectral plane (y direction), while simultaneously imaging the near-field pattern (in the x direction) onto the same lane with a 1:1 magnification. The phase mask (modulator 406) in the spectral plane S reflects the spectrally dispersed light, which is subsequently redirected by the mirror 414 (for example having transmission of approximately 95%) back to the monochromator 401, where the dispersive operation is reversed, and an xy-image is obtained on the mirror 416.

The reflective mask (modulator 406 and mirror 408) can be constructed of a glass substrate or the like. For example, a mask can be built on a substrate of 200 μm thick glass. The backside of the glass can be sputtered with a reflective material, for example gold, to provide for high reflectivity, for example 90%, and to serve as the mirror 408. The front side of the glass includes a thin film of photo-resist, for example MICROPOSIT® S1805, available from the Shipley Company, L.L.C., Marlborough, Mass. The thickness of the photo-resist is preferably chosen to provide a 180° phase shift of the light passing through the areas covered with photoresist compared to the areas not covered with photoresist. Such a thickness can be determined from the phase matching condition $(2\pi/\lambda)(\eta_{photoresist}-1) \times 2d = \pi$, which gives $d = \lambda/4 (\eta_{photoresist}-1)$. For example, the photoresist used for the testing apparatus has a thickness $d = 0.98 \mu m/(4 \times 0.62) \approx 0.395 \mu m$.

FIG. 7h shows a mask pattern that can be used for reshaping the higher order modes. The pattern is produced by selectively removing the entire thickness of the photoresist in specified regions using a milling tool 324. The near-field spectra of the laser diode emission projected onto the spectral plane S by the monochromator 401 are observed on the surface of the mask and appear as shown in FIG. 7c. With the mirror 414 flipped to its second position, the CCD 436, supported by a y-axis translation stage (not shown), can scan the spectra with an effective resolution, for example 640×10000 pixels. These spatially resolved spectra are converted into photoresist removal instructions for a second, high-precision, 3D-translation stage (not shown). The resulting phase mask is shown in FIG. 7i. The cylindrical lens 434 can be inserted to allow observation of the Fourier plane in the lateral direction as shown in FIGS. 7f and 7l. Commercially-available analysis and hardware control software, for example LabVIEW software (National Instruments Corporation, Austin, Tex.), can be used for control of these fabrication procedures.

The measured values (obtained using the test apparatus) of the conversion efficiency of the phase mask are close to theory. The total transmission of the system without the mask, which can be determined by replacing the mask with a flat mirror, is dominated by one-pass losses of 18% in the grating 404, a mask reflection loss of approximately 17%, and by s truncation of the beam at the grating 404 and spectral plane S. For example, for a beam of 198 mW (after lens 409), 50 mW power is present at the output of the apparatus (after the mirror 416), yielding the total transmission of the system at 25%.

Figure 9:
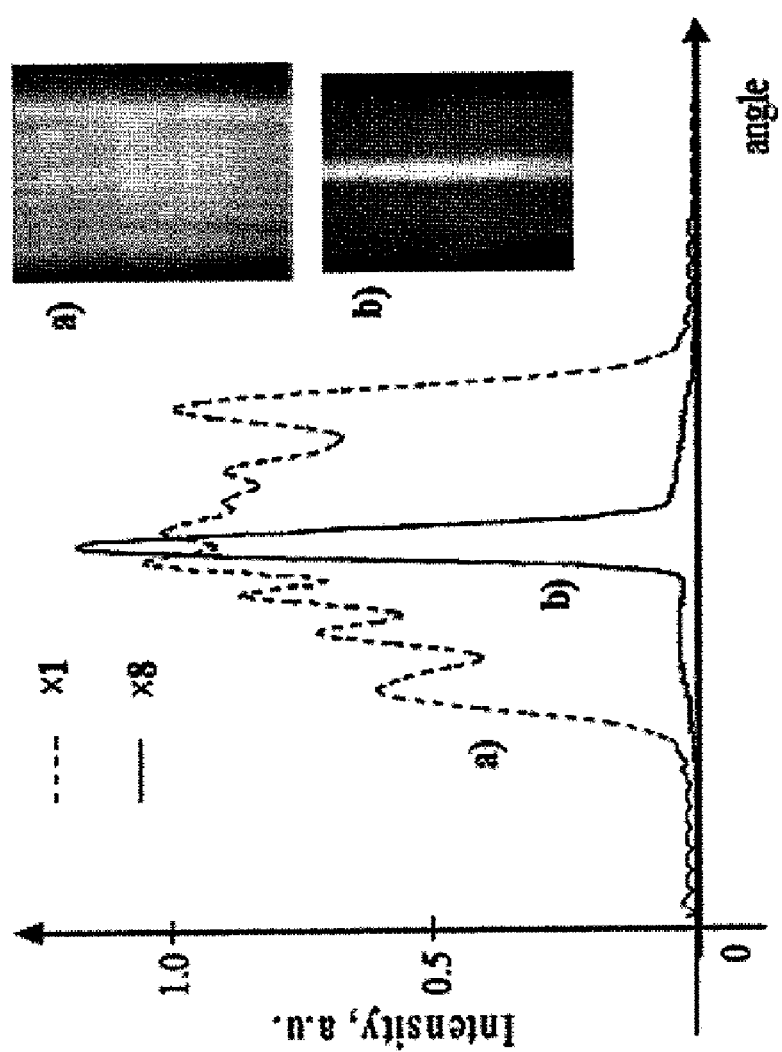
FIG. 9 shows the far-field patterns of an output beam with and without phase modulation.

FIG. 9 shows the far-field patterns of the output beam with and without phase modulation by the modulator 406. The profile (a) is measured with a flat mirror instead of the modulator 406, and the profile (b) is measured with the binary mask shown in FIG. 7i in use as the modulator 406. A power of 30 mW is recovered in the beam profile (b) in FIG. 9 after the spatial filtering. The aperture diameter of the spatial filter is set to the theoretical mode-diameter of the resulting peak. This test data suggests that a mode conversion efficiency of multi-mode power to single mode power of 60% with a 25% total insertion loss has been achieved. Alternative grating and phase mask plates can be used to eliminate truncation losses at the grating and phase mask planes and will allow a laser-to-fiber coupling efficiency of greater than 50%. With adequate AR coatings on all elements, the theoretical limit of the binary mask (70% for 10 lateral modes) can be achieved. Advanced multi-layer optical mask designs can further increase this value. These predicted values are at least comparable in efficiency with indirect beam conversion techniques such as laser diode pumped YAGs and fiber lasers.

To demonstrate the single-spatial-mode nature of the light at the output of the system shown in FIG. 8, the coupling efficiency can be measured into a single-mode fiber 422. A cylindrical lens 432, for example with f=100 mm, at the output reshapes the beam to a circular form, allowing efficient coupling to the single-mode optical fiber by a lens 418, for example with 12 mm focal length. The optical fiber 422 can be, for example, a Model F-SF made by Newport, having a cutoff frequency $\lambda_c$ of approximately 820 nm and a mode-field diameter of 5.6 μm. Counting the insertion losses of the two lenses 418 and 432 (0.93×0.90 in this example) and fiber interface losses (0.96×0.96 in this example), the measured output power of 21 mW from the fiber corresponds to a single-lobe diffraction limited input beam of 30 mW. The replacement of the mask (modulator 406) by a flat mirror (case (a) of FIG. 9) immediately expands the beam, and the coupling efficiency to the fiber decreases by more than 10 times.

Thus, disclosed herein is a method and apparatus that provides for conversion of a broad-area semiconductor laser emission into a single-lobe diffraction limited spot using an external optical device. The combining system and method can be implemented with laser diodes of any wavelength and allows for high-speed modulation. These properties are attractive features of laser sources for numerous applications, including ranging, free space communication, and HDTV projection systems, for which no high-power-capable external modulators have previously been available. Embodiments of systems and methods described herein can be broadband in nature, making them convenient for ultra-short pulsed laser systems as well. Some examples of systems that can incorporate the method and apparatus disclosed herein will now be described with reference to FIGS. 10-12.

Figure 10:
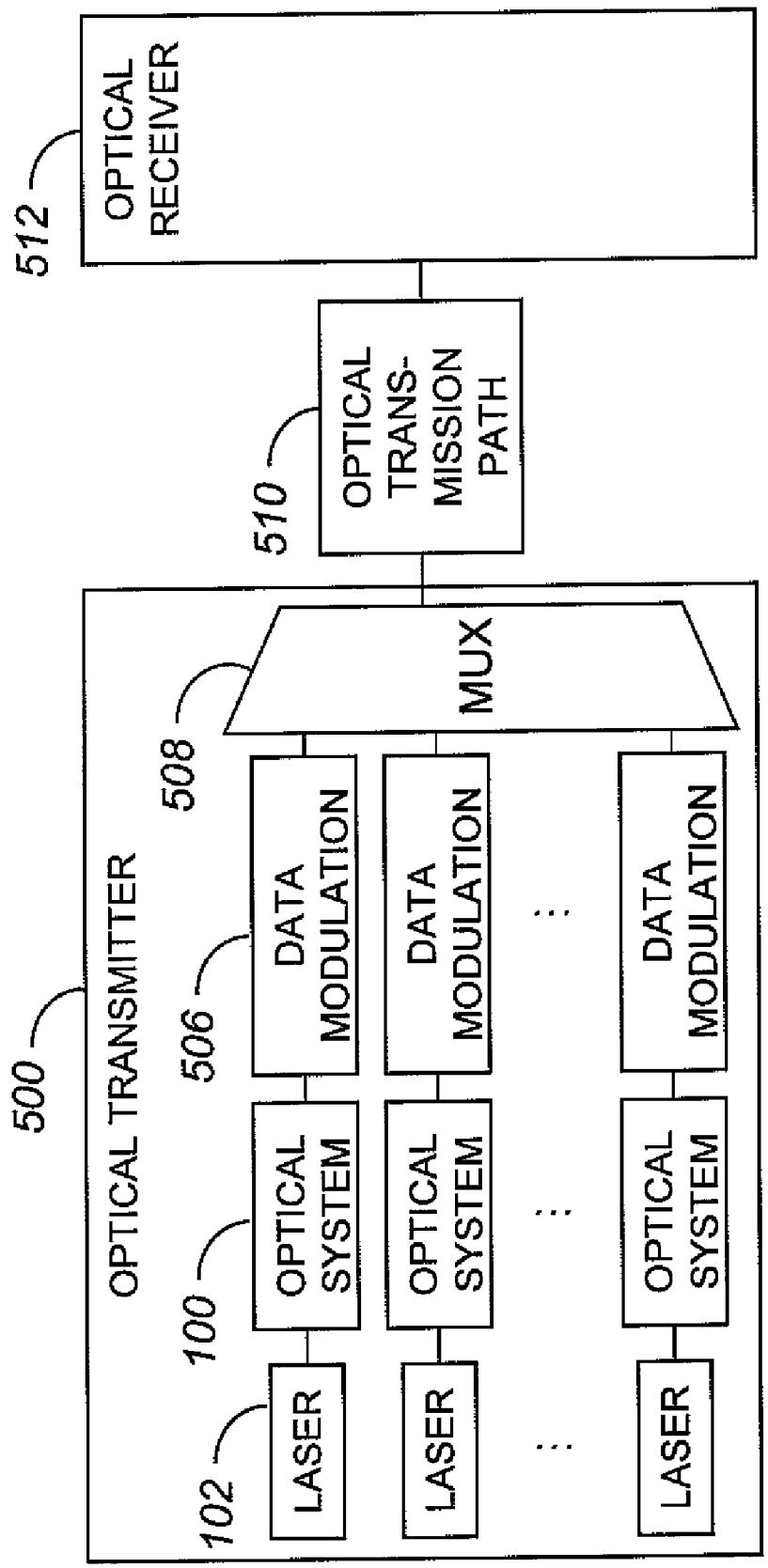
FIG. 10 shows a block diagram illustrating an example of a wavelength division multiplexing (WDM) optical transmission system.

Referring first to FIG. 10, which is a block diagram illustrating an example of a wavelength division multiplexing (WDM) optical transmission system that includes a semiconductor laser 102 and optical system 100 as described herein. The optical transmission system includes an optical transmitter 500, an optical transmission path 510, and an optical receiver 512. The optical transmitter 500 includes semiconductor lasers 102 and an optical systems 100, which can be implemented according to any of the embodiments disclosed herein. In preferred embodiments each of the lasers 102 emits mutually differing wavelengths of light. The optical transmitter 500 also includes data modulators 506, which modulate the optical propagated wave output from the respective optical system 100 according to a data signal, and an optical multiplexer (MUX) 508, which multiplexes optical signals output from the data modulators 506. The optical transmitter 500 can further include an optical post-amplifier (not shown) as necessary. The optical transmission path 510 preferably comprises a dispersion-shifted fiber. The optical receiver 512 includes optical amplifiers, an optical demultiplexer, which demultiplexes the optical signal (as multiplexed by the MUX 508) in order to recover the optical signal of each wavelength of light, opto-electric converters, which convert the optical signals of each wavelength to electrical signals, and electrical reception circuitry, which recovers the data signal from each electrical signal. Additional features, functions, and components of the WDM optical system can include those known in the art, for example as described in U.S. Pat. No. 6,490,064 to Sakamoto et al., which is hereby incorporated by reference.

Figure 11:
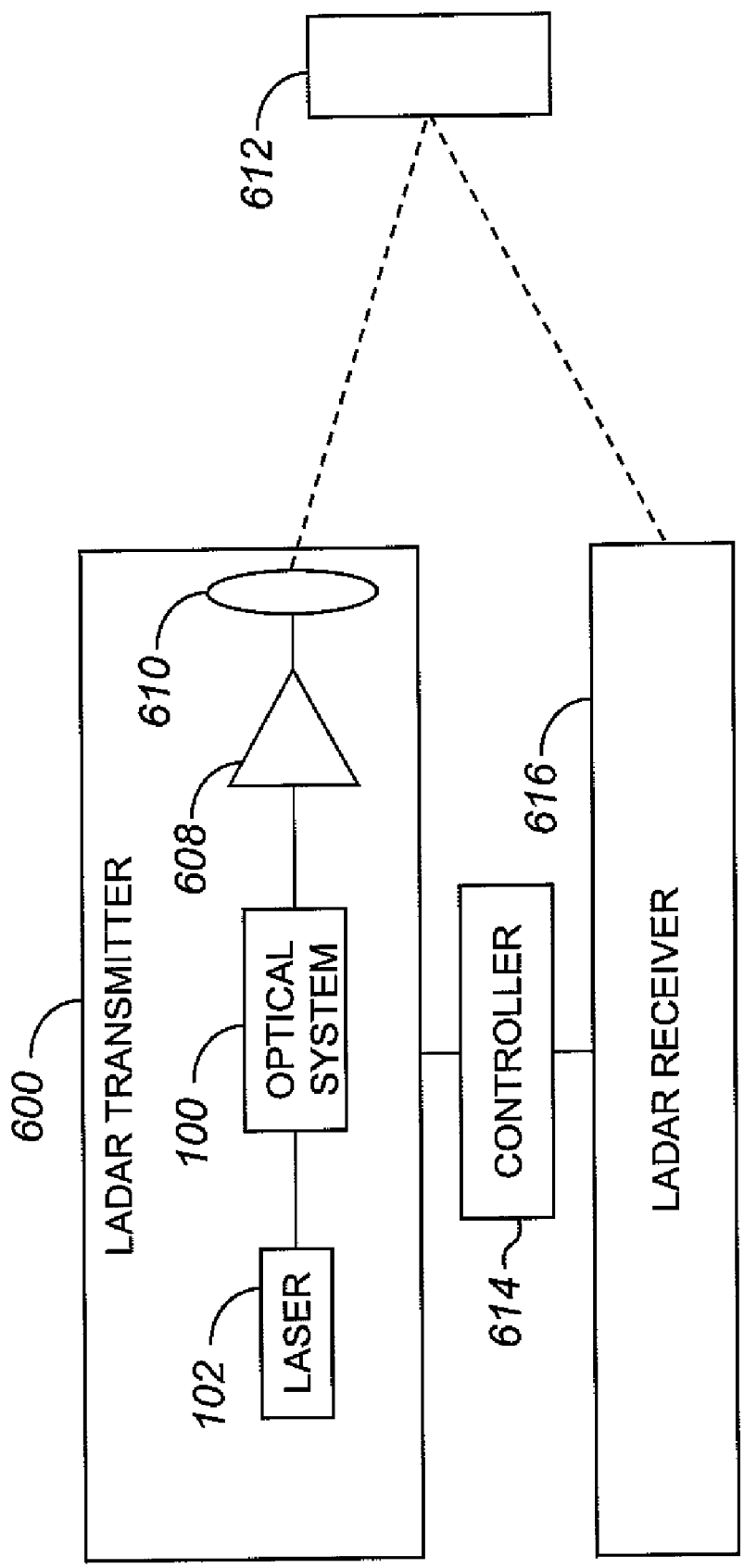
FIG. 11 shows a block diagram illustrating an example of a ladar system.

Next, referring to FIG. 11, which is a block diagram illustrating an example of a ladar system useful for identifying and analyzing a target of interest. The ladar system shown in FIG. 11 includes a semiconductor laser 102 and optical system 100 as described herein. The ladar system includes a ladar transmitter 600, a ladar receiver 616, and a controller 614. The ladar transmitter 600 also includes an optical amplifier 608 for increasing the power of the output signal and transmission optics 610 for aiding in transmission of the output beam. The ladar receiver 616 receives and responds to backscattered light produced by the interaction of the transmit laser beam with the target 612. The ladar receiver 616 can include such things as an optical fiber pre-amplifier for amplifying the backscattered light to thereby produce an amplified return laser beam and a phase locked loop for receiving the primary laser beam and the amplified return laser beam for generating an electrical signal indicative of range, velocity, and a characteristic signature of the target 612. The controller 614 controls the functions of the ladar transmitter 600 and receiver 616 and can comprise a computer or the like. Additional features, functions, and components of the ladar system can include those known in the art, for example as described in U.S. Pat. No. 5,847,816 to Zediker et al., which is hereby incorporated by reference.

Figure 12:
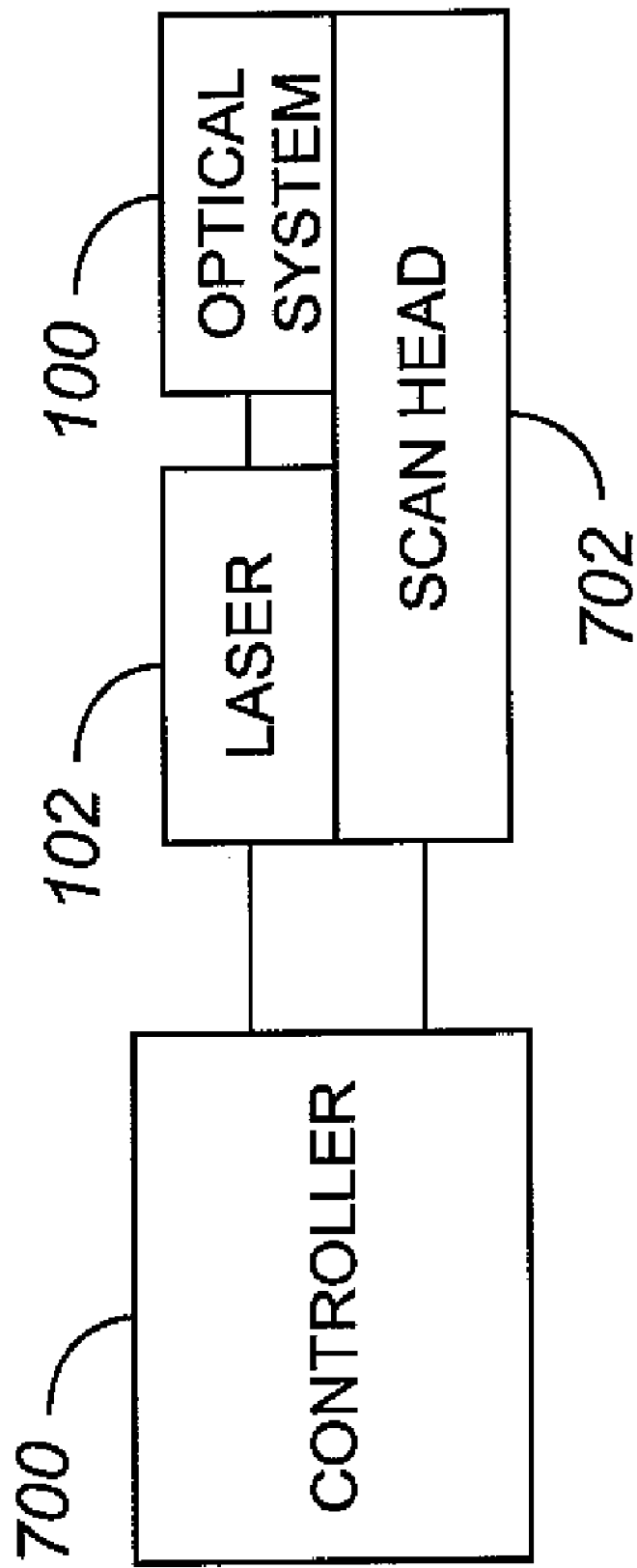
FIG. 12 shows a block diagram illustrating an example of a laser cutting apparatus.

Finally, referring to FIG. 12, which is a block diagram illustrating an example of a laser cutting apparatus that includes a semiconductor laser 102 and optical system 100 as described herein. The laser cutting apparatus also includes a controller 700 and a scan head 702. The scan head 702 provides a movable platform for supporting and moving the laser 102 and optical system 100 relative to a work piece (not shown) or otherwise capable of adjusting the trajectory of light from the optical system 100. The controller 700 controls the movement of the scan head 702 and also controls the activation/deactivation of the laser 102 according to instructions within the controller 700, or accessible to the controller 700, for desired cuts to the work piece. Those skilled in the art will appreciate that additional optical amplifiers and optical elements will be included in the laser cutting apparatus as necessary to produce a suitable cutting laser from the optical signal emitted by the optical system 100. Additional features, functions, and components of the laser cutting apparatus can include those known in the art, for example as described in U.S. Pat. No. 5,262,612 to Momany et al. and U.S. Pat. No. 6,191,382 to Damikolas, both of which are hereby incorporated by reference.

While various embodiments in accordance with the principles disclosed herein have been described above, it should be understood that they have been presented by way of example only, and are not limiting. Thus, the breadth and scope of the invention(s) are not to be limited by any of the above-described exemplary embodiments, but are defined only by the claims and their equivalents. Furthermore, any advantages and features noted above are for the particular, exemplary embodiments that are being described, are provided in described and do not limit the application of the claims to processes and structures accomplishing any or all of the above advantages.

Additionally, the section headings herein are provided for consistency with the suggestions under 37 CFR 1.77 or otherwise to provide organizational cues. These headings shall not limit or characterize the invention(s) set out in any claims that may issue from this disclosure. Specifically and by way of example, although the headings refer to a "Technical Field," such claims should not be limited by the language chosen under this heading to describe the so-called technical field. Further, a description of a technology in the "Background" is not to be construed as an admission that technology is prior art to any invention(s) in this disclosure. Neither is the "Brief Summary" to be considered as a characterization of the invention(s) set forth in issued claims. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention(s), and their equivalents, that are protected thereby. In all instances, the scope of such claims shall be considered on their own merits in light of this disclosure, but should not be constrained by the headings set forth herein. Unless otherwise expressly stated, all terms utilized in the appended claims are intended to be given their common and ordinary meaning, and are not intended to be limited to the examples given above.

What is claimed is:

1. An apparatus comprising:
    a spatial phase modulator for spatially modulating a multimode optical signal from a semiconductor laser to produce a combined-mode optical signal, the multimode optical signal from the laser comprising a plurality of lateral modes, wherein the spatial phase modulator combines the lateral modes into a diffraction-limited beam, wherein the spatial phase modulator comprises a binary phase mask, wherein the binary phase mask comprises first regions and second regions, wherein light passing through the first regions experience a 180 degree phase shift compared to light passing through the second regions; and
    a coupling optical system for wavelength-demultiplexing the multimode optical signal before the multimode optical signal is spatially modulated by the spatial phase modulator and for wavelength-multiplexing the combined-mode optical signal.

2. The apparatus of claim 1, wherein the semiconductor laser is comprised of an edge-emitting laser diode.

3. The apparatus of claim 2, wherein the edge-emitting laser diode is comprised of a broad-area laser diode.

4. The apparatus of claim 1 wherein the coupling optical system comprises a diffraction grating for both multiplexing and demultiplexing the optical signal.

5. The apparatus of claim 1 wherein the coupling optical system comprises a first diffraction grating for wavelength-demultiplexing the multimode optical signal before the multimode optical signal is spatially modulated by the spatial phase modulator and a second diffraction grating for wavelength-multiplexing the combined-mode optical signal.

6. The apparatus of claim 5, wherein the first diffraction grating is substantially the same as the second diffraction grating.

7. The apparatus of claim 1, further comprising a data modulator for modulating the combined-mode optical signal according to a data signal.

8. The apparatus of claim 1, further comprising a receiver for receiving backscattered light produced by interaction of the combined-mode optical signal with a target and for generating a signal indicative of at least one of a range, a velocity, and a characteristic signature of the target.

9. The apparatus of claim 1, further comprising a scan head for moving a cutting laser relative to a work piece, the cutting laser comprising light from the combined-mode optical signal, and a controller for controlling the movement by the scan head and for controlling activation/deactivation of the semiconductor laser.

10. A method comprising:
wavelength-demultiplexing a multimode optical signal from a semiconductor laser to produce a spectrally-dispersed optical signal, the multimode optical signal comprising a plurality of lateral modes;
spatially modulating the spectrally-dispersed optical signal into a combined-mode optical signal wherein the lateral modes are combined into a diffraction-limited beam, wherein the modulating comprises providing a binary phase mask for modulating the spectrally dispersed optical signal, wherein the binary phase mask comprises a first region and a second region, wherein light passing through the first region experiences a 180 degree phase shift compared to light passing through the second region; and
wavelength-multiplexing the combined-mode optical signal.

11. The method of claim 10, wherein the semiconductor laser is comprised of an edge-emitting laser diode.

12. The method of claim 11, wherein the edge-emitting laser diode is comprised of a broad-area laser diode.

13. The method of claim 10, further comprising providing a diffraction grating for both the wavelength-demultiplexing of the multimode optical signal and the wavelength-multiplexing of the combined-mode optical signal.

14. The method of claim 10, further comprising providing a first diffraction grating for the wavelength-demultiplexing of the multimode optical signal and providing a second diffraction grating for the wavelength-multiplexing of the combined-mode optical signal.

15. The method of claim 14, wherein the first diffraction grating is substantially the same as the second diffraction grating.

* * * * *